United States Patent [19]
Whitaker

[11] Patent Number: 5,111,429
[45] Date of Patent: May 5, 1992

[54] SINGLE EVENT UPSET HARDENING CMOS MEMORY CIRCUIT

[75] Inventor: Sterling R. Whitaker, Moscow, Id.

[73] Assignee: Idaho Research Foundation, Inc., Moscow, Id.

[21] Appl. No.: 609,583

[22] Filed: Nov. 6, 1990

[51] Int. Cl.[5] ............................................. G11C 7/00
[52] U.S. Cl. .................................. 365/156; 365/154; 365/190; 365/208
[58] Field of Search ............... 365/154, 156, 190, 207, 365/208, 78

[56] References Cited

U.S. PATENT DOCUMENTS

| | | | |
|---|---|---|---|
| 4,782,467 | 11/1988 | Belt et al. | 365/190 |
| 4,805,148 | 2/1989 | Diehl-Nagle et al. | 365/154 |
| 5,043,939 | 8/1991 | Slamowitz et al. | 365/154 |

Primary Examiner—Joseph E. Clawson, Jr.
Attorney, Agent, or Firm—Limbach & Limbach

[57] ABSTRACT

A CMOS storage cell includes an n-channel storage circuit which has cross coupled n-channel storage transistors and a p-channel storage circuit including cross coupled p-channel storage transistors. Each of the n-channel storage transistors has an n-channel load transistor and each of the p-channel storage transistors has a p-channel load transistor. The n-channel load transistors are coupled to be controlled by the p-channel storage circuit and the p-channel load transistors are coupled to be controlled by the n-channel storage circuit. The n-channel load transistors are designed to carry less current than the p-channel storage transistors and the p-channel load transistors are designed to carry less current than the n-channel storage transistors. The storage cell can be used for a Static RAM or for a flip flop.

10 Claims, 8 Drawing Sheets

FIG. 6  SEU HARDENED FLIP FLOP CELL

SINGLE EVENT UPSET HARDENING CMOS MEMORY CIRCUIT

FIELD OF THE INVENTION

This invention relates to the field of semiconductor memory circuits. More particularly, this invention relates to a memory circuit that is hardened against a single event upset.

BACKGROUND OF THE INVENTION

Semiconductor memory cells are well known and have been used extensively for many years to store a single bit of binary data as a "1" or "0". Unfortunately, the data bit stored in the cell can be corrupted if the cell is exposed to an ionized particle such as an α particle, T, Ma and P. Dressendorfer, *Ionizing Radiation Effects in MOS Devices & Circuits*, New York, NY, John Wiley & Sons, 1989, Chapter 9. Current induced by a particle hit flows from an n-type diffusion to a p-type diffusion. Thus, a "1" can be upset in an NMOS static RAM cell and a "0" can be upset in a PMOS static RAM cell.

A variety of techniques have been employed to attempt to prevent the data stored in a cell from inadvertently changing states even when the cell is struck by a charged particle. For example, Japanese patent 62-154296, issued on July 9, 1987 and invented by Honjo and Japanese patent 57-12486, issued on Jan. 1, 1982 and invented by Yoshimoto each teach coupling a capacitor between the drains of the two storage transistors. Because the voltage across a capacitor cannot change instantaneously, the two nodes will track one another in the event that there is an exposure to a charged particle. In the event that the voltage excursion due to the charged particle is of sufficiently short duration, the state of the cell will not change inadvertently.

In another approach, the transistor count in the basic cell is doubled, L. Rockett, *An SEU Hardened CMOS Data Latch Design*, IEEE Transactions on Nuclear Science, Vol. 35, No. 6, pp. 1682-1687, Dec., 1988. While, the data is stable, the loading seen by the clock signal in a circuit built according to the Rockett paper is such that the circuit performance is degraded.

A static RAM design is needed which is immune to a SEU and which provides acceptable performance.

SUMMARY OF THE INVENTION

A CMOS storage cell includes an n-channel storage circuit which has cross coupled n-channel storage transistors and a p-channel storage circuit including cross coupled p-channel storage transistors. Each of the n-channel storage transistors has an n-channel load transistor and each of the p-channel storage transistors has a p-channel load transistor. The n-channel load transistors are coupled to be controlled by the p-channel storage circuit and the p-channel load transistors are coupled to be controlled by the n-channel storage circuit. The n-channel load transistors are designed to carry less current than the p-channel storage transistors and the p-channel load transistors are designed to carry less current than the n-channel storage transistors. The storage cell can be used for a Static RAM or for a flip flop.

DETAILED DESCRIPTION OF THE PREFERRED EMBODIMENT

Figure 1:
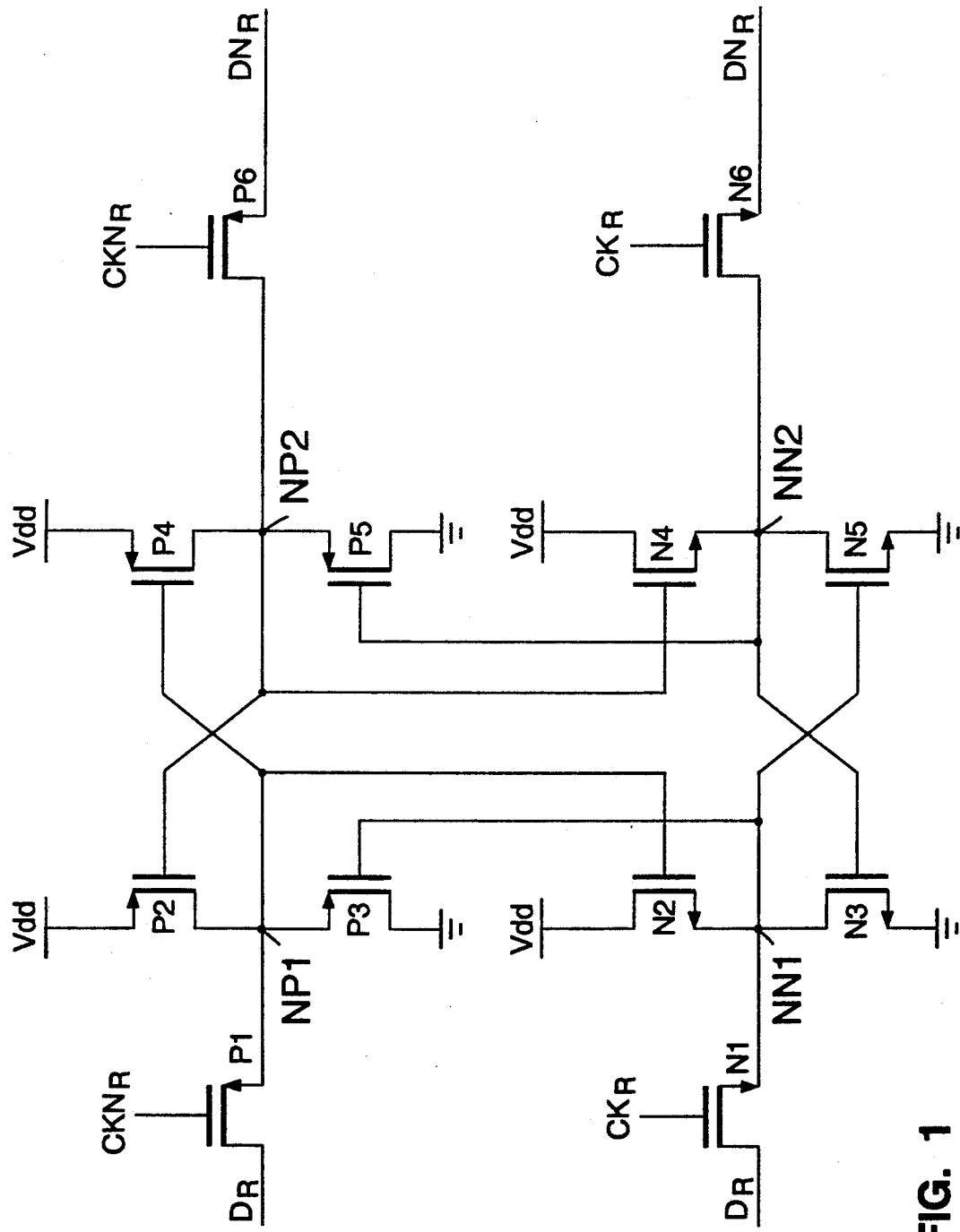
FIG. 1 shows a circuit schematic diagram for a static RAM cell according to the present invention.

FIG. 1 shows a circuit schematic diagram of a RAM cell according to the preferred embodiment of the present invention. The RAM cell of FIG. 1 is hardened against a single event upset. Note that each transistor in the top half of the figure is a p-channel transistor and that each transistor in the bottom half of the figure is a n-channel transistor. This CMOS circuit is includes a cross coupled pair of p-channel MOS transistors and a cross coupled pair of n-channel MOS transistors.

There is a power node Vdd and a ground terminal Vss. A first end of the channel of a p-channel MOS pass transistor P1 is coupled to a data line $D_R$ and a second end to a first p-channel data storage node NP1. The gate of the pass transistor P1 is coupled to external control circuitry which is not shown and controlled by the clock signal $CKN_R$.

The source of a p-channel storage MOS transistor P2 is coupled to Vdd. The drain of the transistor P2 is coupled to the second end of the channel of the pass transistor P1, the storage node NP1 and to the source of a p-channel MOS load transistor P3. The drain of the load transistor P3 is coupled to ground Vss.

The source of a p-channel storage MOS transistor P4 is coupled to Vdd. The drain of P4 is coupled to a second p-channel data storage node NP2 and to the source of a p-channel MOS load transistor P5. The drain of the load transistor P5 is coupled to ground Vss. A first end of a p-channel MOS pass transistor P6 is coupled to an inverse data line $DN_R$. The second end of the pass transistor P6 is coupled to a second p-channel storage node NP2. The gate of the pass transistor P6 is controlled by external circuitry which is not shown and is controlled by the clock signal $CKN_R$.

The two p-channel storage transistors P2 and P4 are cross coupled. The gate of the transistor P2 is coupled to and controlled by the drain of the transistor P4. The gate of the transistor P4 is coupled to and controlled by the drain of the transistor P2.

A first end of the channel of a n-channel MOS pass transistor N1 is coupled to the data line $D_R$ and a second end to a first n-channel data storage node NN1. The gate of the pass transistor N1 is coupled to external control circuitry which is not shown and controlled by the clock signal $CK_R$. The drain of a n-channel transistor MOS load transistor N2 is coupled to Vdd. The source of the load transistor N2 is coupled to the second end of the channel of the pass transistor N1, the storage node NN1 and to the drain of a n-channel MOS transistor N3. The source of the transistor N3 is coupled to ground Vss.

The drain of a n-channel MOS load transistor N4 is coupled to Vdd. The source of the load transistor N4 is coupled to a second n-channel data storage node NN2 and to the drain of a n-channel MOS transistor N5. The source of the transistor N5 is coupled to ground Vss. A first end of a n-channel MOS pass transistor N6 is coupled to the inverse data line $DN_R$. The second end of the pass transistor N6 is coupled to a second n-channel storage node NN2. The gate of the pass transistor N6 is controlled by external circuitry which is not shown and is controlled by the clock signal $CK_R$.

The two n-channel storage transistors N3 and N5 are cross coupled. The gate of the transistor N3 is coupled to and controlled by the drain of the transistor N5. The gate of the transistor N5 is coupled to and controlled by the drain of the transistor N3.

The n-channel storage circuit and the p-channel storage circuit redundantly store a binary data bit. The two circuits are cross coupled in that the p-channel load transistors P3 and P5 are coupled to and controlled by the n-channel storage nodes NN1 and NN2 and the n-channel load transistors are coupled to and controlled by the p-channel storage nodes NP1 and NP2. In particular, the gate of the p-channel load transistor P3 is coupled to and controlled by the drain of the n-channel transistor N3. The gate of the p-channel load transistor P5 is coupled to and controlled by the drain of the n-channel transistor N5. The gate of the n-channel load transistor N2 is coupled to and controlled by the drain of the p-channel transistor P2. The gate of the n-channel load transistor N4 is coupled to and controlled by the drain of the p-channel transistor P4.

In order to perform the desired function, the n-channel load transistors N2 and N4 are designed to be weak in comparison to the n-channel transistors N3 and N5 and the load p-channel transistors P3 and P5 are designed to be weak in comparison to the p-channel transistors P2 and P4. The remainder of the transistors are designed to meet normal design considerations for a RAM cell to allow the cell to written, read and meet performance criterion.

In particular, Table I shows the channel width and length for the preferred RAM cell according to the present invention. Note that each transistor has the same length of 1.0 μm but that channel width varies to adjust the relative strength, i.e. current carrying capability, of the transistors.

TABLE I

| Transistor | Wn | Ln | Transistor | Wp | Lp |
|---|---|---|---|---|---|
| N1 | 6.4 | 1.0 | P1 | 6.4 | 1.0 |
| N2 | 2.4 | 1.0 | P2 | 6.9 | 1.0 |
| N3 | 6.9 | 1.0 | P3 | 2.4 | 1.0 |
| N4 | 2.4 | 1.0 | P4 | 6.9 | 1.0 |
| N5 | 6.9 | 1.0 | P5 | 2.4 | 1.0 |
| N6 | 6.4 | 1.0 | P6 | 6.4 | 1.0 |

Figure 2A:
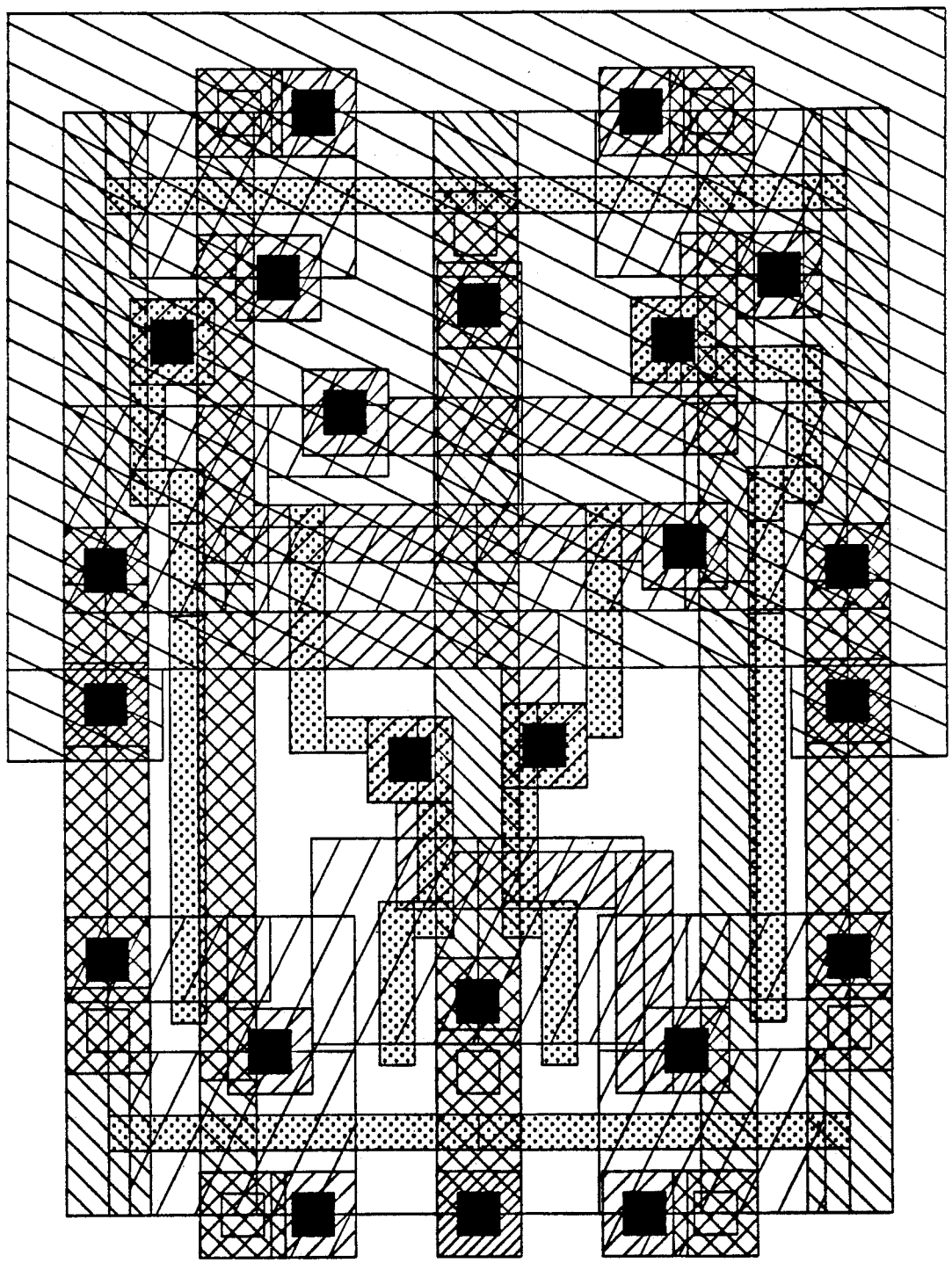
FIG. 2A shows a semiconductor mask layout for the RAM cell of FIG. 1.
Figure 8:
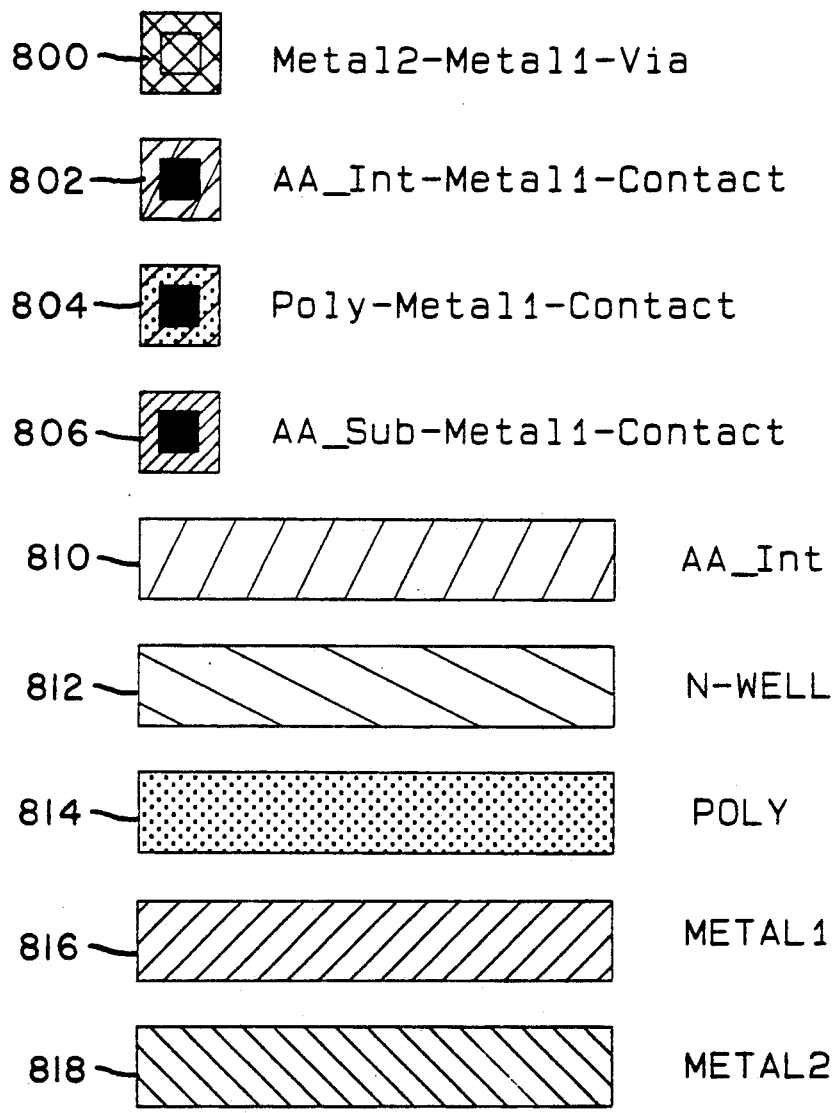
FIG. 8 is a key identifying the cross hatching of FIGS. 2A, 2B and 7.

A RAM cell implemented according to the present invention requires an increase of about 75% in area over a traditional 6 transistor RAM cell. The preferred RAM cell mask layout is shown in FIG. 2A for a single polysilicon double metal layer CMOS process. The cross-hatching to identify the individual layers is shown in FIG. 8.

A person of ordinary skill in the art can readily identify the structures shown in FIG. 2A. Nevertheless, the transistors of the circuit schematic of FIG. 1 are identified in FIG. 2B by encircling the active regions of their gate electrodes and using the same transistor reference indicators to thereby simplify understanding. As can readily be determined from FIG. 2B, the size of the gates of the transistors corresponds to Table I.

Figure 2B:
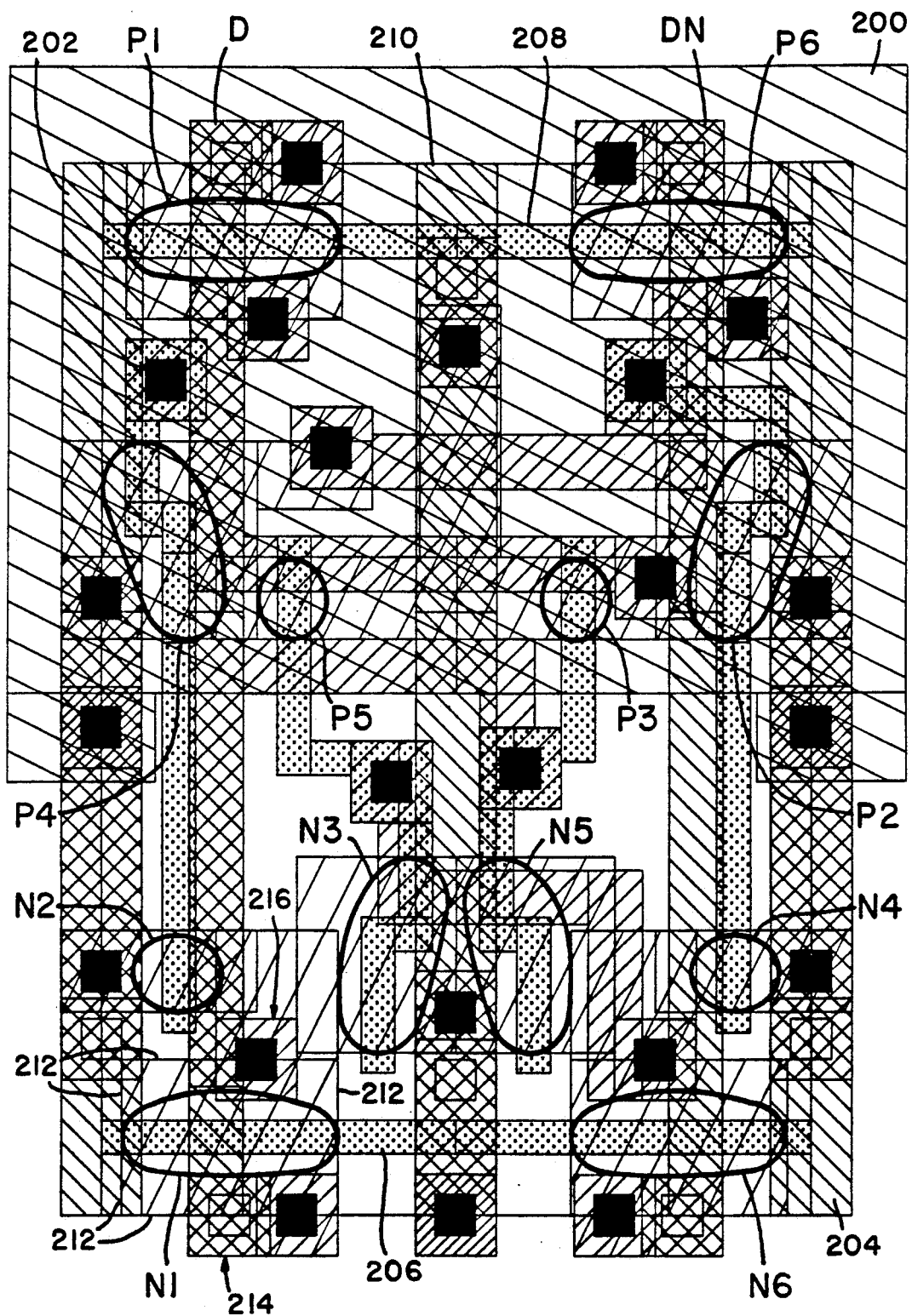
FIG. 2B is the mask layout of FIG. 2A identifying the location of the transistors of the RAM cell of FIG. 1.

An n-well 200 is formed over the upper portion of FIG. 2B wherein the p-channel transistors P1 through P6 are formed. A Vdd power rail 202 and 204 run vertically the length of the RAM cell of FIG. 2B and are formed of the metal2 layer 818 (FIG. 8). It will be understood to one of ordinary skill in the art that the layout of FIG. 2B is artificially truncated for simplicity. In other words, the various traces shown will extend beyond the edge of the diagram to form an array of RAM cells. For example, the clock line $CK_R$ 206 will extend outward from either side of the figure as will the inverted clock line $CKN_R$ 208. The data line $D_R$ and the inverse data line $DN_R$ each run the vertical length of FIG. 2B. The ground level Vss similarly runs the vertical length of FIG. 2B and is formed of the metal2 layer 210.

As one example of how to read the mask layout of FIG. 2B, transistor N1 is formed having the clock line $CK_R$ of poly trace 206 as the gate. As is well known, the source and drain regions are formed in the underlying semiconductor substrate adjacent the region under the gate. The impurities for the source and drain regions are placed within the boundaries of the mask 212 by any known technique. Note that the gate of the transistor N1 has a width to length ratio of 6.4 to 1 (Table I). One end of the channel is coupled to the data line $D_R$ by the contact 214. The other end of the channel is coupled to the n-channel storage node NN1 by the contact 216.

The RAM cell of FIG. 1 prevents a single event upset. First, the stored bit is stored in two different places, i.e. the cross coupled n-channel storage transistors N3 and N5 and the cross coupled p-channel storage transistors P2 and P4. This redundancy provides and maintains a source of uncorrupted data for after an occurrence of a single event upset. Second, the feedback path between n-channel storage circuit and the p-channel storage circuit cause the lost data to recover after a particle strike.

Finally, use is made of the fact that the current that is induced by the particle strike of a single event upset causes current flow from a n-type diffusion to a p-type diffusion. Thus, if either of the n-channel storage nodes NN1 or NN2 are storing a "0" that data cannot be lost by the current induced by a particle hit from a single event upset. Similarly, if either of the p-channel storage node NP1 or NP2 are storing a "1" that data cannot be lost by a single event upset.

If the n-channel storage node NN1 is storing a "1" and is hit by a particle, a condition that would cause the loss of data in a non-hardened circuit, the node NN1 is driven to a "0" by the current flow and the n-channel transistor N5 is turned off leaving the second n-channel storage NN2 at "0". The p-channel load transistor P3 turns on, but because it is designed to be weak in comparison to the storage transistors it cannot overdrive the p-channel storage NP1. Thus, the n-channel load transistor N2, which is controlled by the p-channel storage node NP1, remains in an on conditions thereby restoring the n-channel storage node NN1 to a "1".

Similarly, if the p-channel storage node NP1 is storing a "0" and is hit by a particle, a condition that would cause the loss of data in a non-hardened circuit, the node NP1 is driven to a "1" by the current flow and the n-channel transistor P4 is turned off leaving the second n-channel storage NP2 at "1". The n-channel load transistor N2 turns on, but because it is designed to be weak in comparison to the storage transistors it cannot overdrive the n-channel storage NN1. Thus, the p-channel load transistor P3, which is controlled by the n-channel storage node NN1, remains in an on conditions thereby restoring the p-channel storage node NP1 to a "0".

The RAM cell was designed for the desired read and write times resulting in the transistor sizes of Table I. Circuit simulations were run using SPICE and assuming worst case conditions; Vdd=4.3V, $T_j$=140° C. and 3σ parameters. A particle hit adding $5pC$ of energy to the p-channel storage node NP1 and removing $5pC$ of energy to the n-channel storage node NN1 was simulated.

Figure 3:
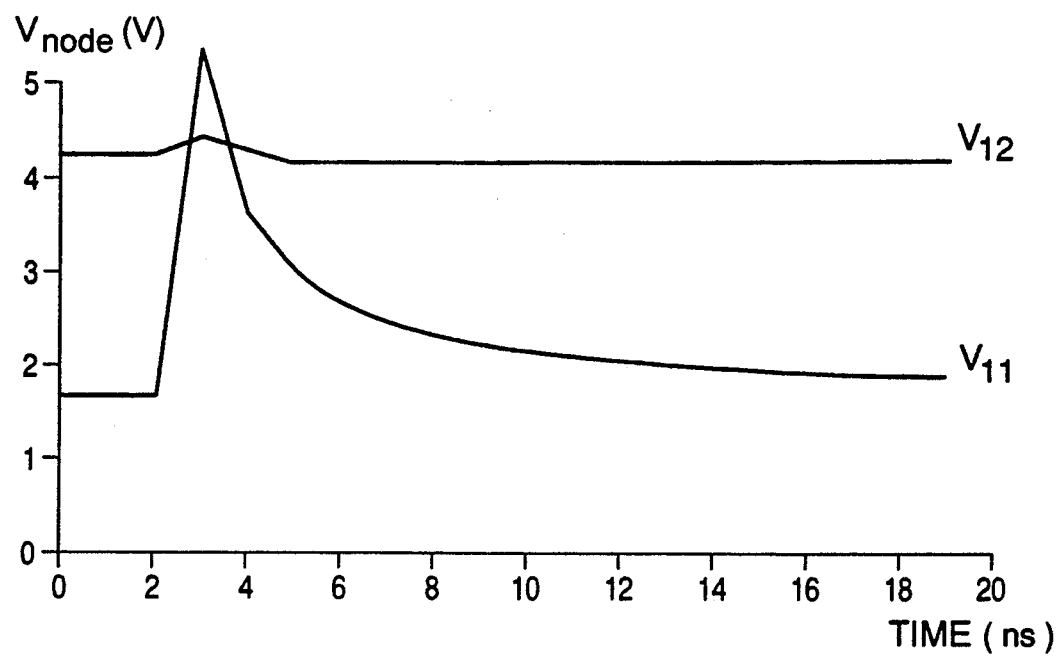
FIG. 3 shows a graph of voltage vs. time for the recovery of the circuit of FIG. 1 from a single event upset occurrence at the p-channel storage node NP1.
Figure 4:
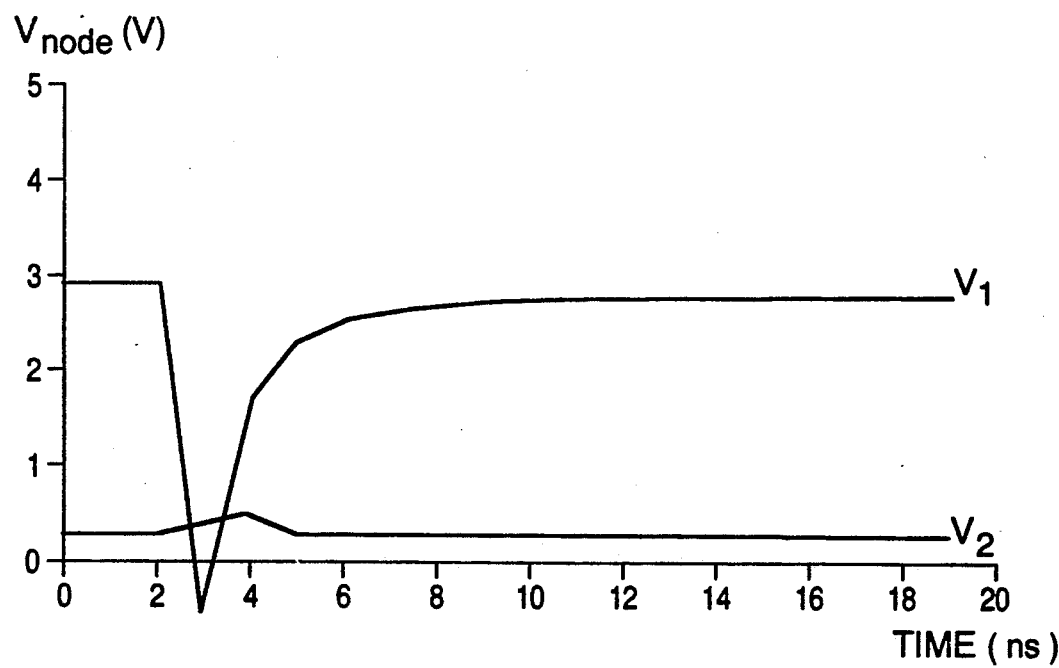
FIG. 4 shows a graph of voltage vs. time for the recovery of the circuit of FIG. 1 from a single event upset occurrence at the n-channel storage node NN1.

FIG. 3 shows the simulated recovery response of a particle hit to the p-channel storage node NP1. FIG. 4 shows the simulated recovery response of a particle hit to the n-channel storage node NN1. Both SPICE simulations show a recovery duration of only a few nanoseconds. The p-channel storage node "0" and the n-channel storage node "1" are degraded due to device threshold and body effect. However, these levels are acceptable and pose no design problems.

Because the circuit is coupled to the data line $D_R$ and the inverse data line $DN_R$ from both the p-channel storage circuit and the n-channel storage circuit, those lines will be driven hard to both rails during a read cycle. For example, when reading the RAM cell, the p-channel section will drive the data line $D_R$ to Vdd when a "1" is stored and the n-channel section will drive the inverse data line $DN_R$ to Vss.

The hardness of the cell design is independent of processing and parameters because it is the feedback and transistor size ratios that provides the single event upset hardness. This is a significant advantage because process variations will not affect the hardness of the circuit to a single event upset.

Figure 5:
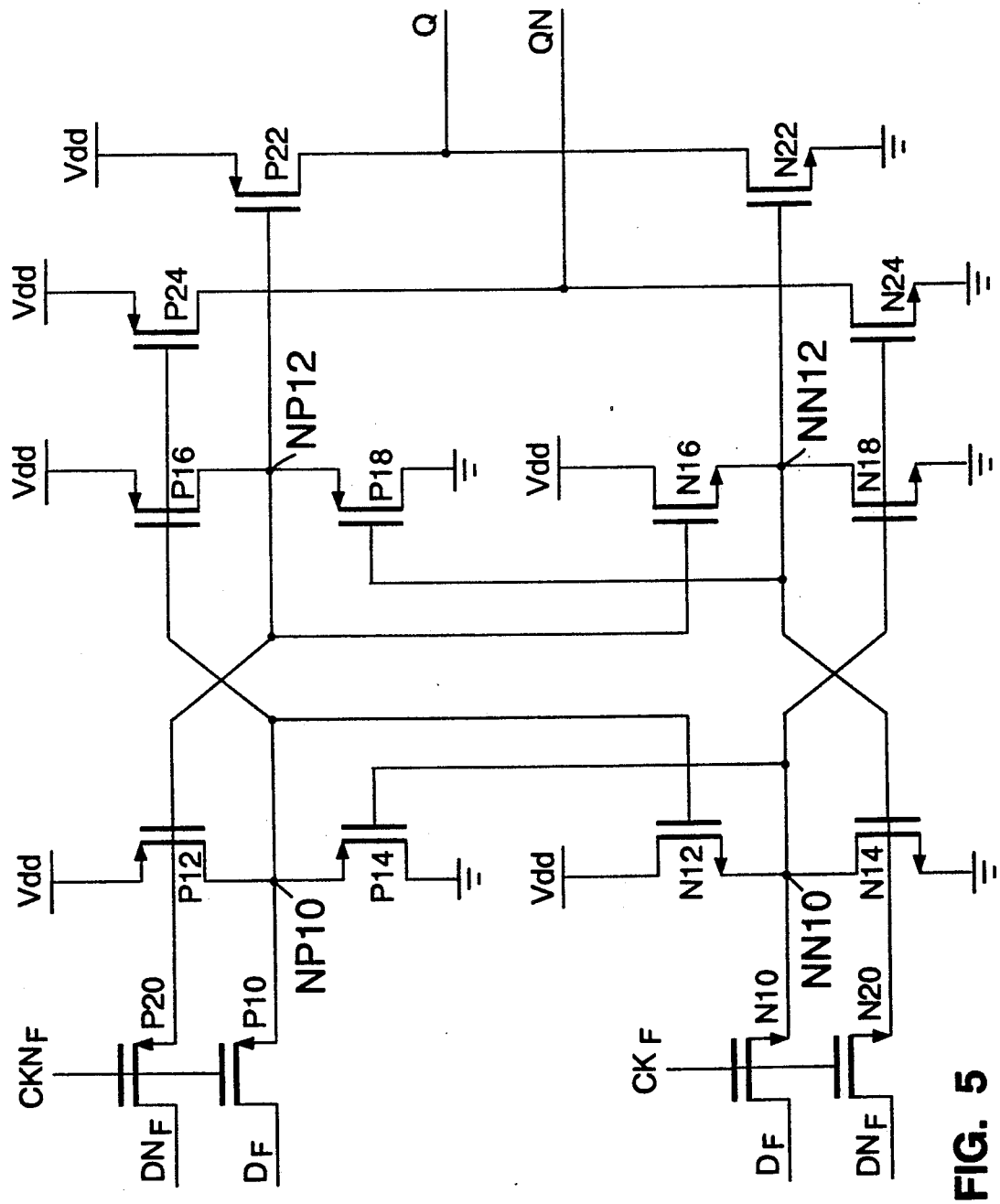
FIG. 5 shows, a circuit schematic diagram for a flip flop according to the present invention.

A flip flop can also be built utilizing the concepts of the present invention. In a flip flop cell containing a master and a slave section each flip flop section is basically a RAM cell. FIG. 5 shows a circuit schematic for a flip flop using the present invention. Similar to the RAM cell, half the circuit contains purely n-type transistors and the other half contains purely p-type transistors. Similar to the schematic drawing for FIG. 1 the n-type transistors are at the bottom of FIG. 5 and the p-type transistors are at the top.

A data line $D_F$ and an inverse data line $DN_F$ are applied to both the p-channel and n-channel sections of the circuit of FIG. 5. The data line $D_F$ is coupled to one end of the channel of a pass transistor N10. The other end of the channel of N10 is coupled to the n-channel storage node NN10. The drain of the load transistor N12 is coupled to the supply voltage Vdd and the source of N12 is coupled to a first n-channel storage node NN10.

The source of the load transistor N12 is also coupled to the drain of the n-channel storage transistor N14. The source of the transistor N14 is coupled to ground. The drain of a n-channel load transistor N16 is coupled to the voltage supply Vdd. The source of the transistor N16 is coupled to a second n-channel storage node NN12 and to the drain of the n-channel storage transistor N18. The source of the transistor N18 is coupled to ground.

The two storage transistors N14 and N18 are cross coupled. The gate of the storage transistor N14 is coupled to the drain of the storage transistor N18. Similarly, the gate of the storage transistor N18 is coupled to the drain of the storage transistor N14.

The inverse data line $DN_F$ is coupled to one end of the channel of a n-channel pass transistor N20. The other end of the channel of the transistor N20 is coupled to the gate of the n-channel storage transistor N14. A clock signal $CK_F$ is coupled to control the gates of the two n-channel pass transistors N10 and N20.

The gate of the n-channel transistor N22 is coupled to the storage node NN12. The source of the transistor N22 is coupled to ground and the drain is coupled to the positive output Q of the flip flop. The gate of the n-channel output transistor N24 is coupled to the gate of the n-channel storage transistor N18 and to the storage node NN10. The source of the transistor N24 is coupled to ground and the drain is coupled to the negative output QN of the flip flop.

The data line $D_F$ is also coupled to one end of the channel of a p-channel pass transistor P10. The other end of the pass transistor P10 is coupled to the p-channel storage node NP10, the drain of the p-channel storage transistor P12 and the source of the p-channel load transistor P14. The source of the p-channel storage transistor P12 is coupled to the power supply Vdd. The drain of the p-channel load transistor P14 is coupled to ground. The source of the p-channel storage transistor P16 is coupled to the power supply Vdd. The drain of the p-channel storage transistor P16 is coupled to a second p-channel storage node NP12. The source of the p-channel load transistor P18 is coupled to the drain of the transistor P16 and the storage node NP12. The drain of the transistor P18 is coupled to ground.

The storage transistor P12 and P16 are cross coupled. The gate of the storage transistor P12 is coupled to the drain of the transistor P16. The gate of the transistor P16 is coupled to and controlled by the drain of the storage transistor P12.

The gate of the p-channel output transistor P22 is coupled to the storage node NP12. The source of the transistor P22 is coupled to the power supply Vdd and the drain is coupled to the positive output Q of the flip flop. The gate of the p-channel output transistor P24 is coupled to the gate of the transistor P16 and to the storage node NP10. The source of the transistor P24 is coupled to the power supply Vdd and the drain is coupled to the negative output QN of the flip flop.

The inverse data line $DN_F$ is coupled to one end of the channel of a p-channel transistor p-channel20. The other end of the channel of the transistor P20 is coupled to the p-channel storage node NP12. An inverse clock signal $CKN_F$ is coupled to control the gates of the two p-channel pass transistor P10 and P20.

The n-channel load transistors are controlled by the p-channel storage nodes and the p-channel load transistors are controlled by the n-channel storage nodes. In particular, the gate of the n-channel load transistor N12 is coupled to the p-channel storage node NP10. The gate of the n-channel load transistor N16 is coupled to the p-channel storage node NP12. The gate of the p-channel load transistor P14 is coupled to the n-channel storage node NN10. The gate of the p-channel load transistor P18 is coupled to the n-channel storage node NN12.

The RAM cell outputs in the flip flop has been buffered by P22 and N22 for the Q output and by P24 and N24 for the QN output. The buffers allow the outputs Q and QN to have Vdd to Vss operation and to isolate the memory portion of the circuit from any potentially high capacitive load. For some circuits these buffers may not be needed.

Like the RAM cell, the load transistors are designed to be weak in comparison to the storage transistors. Table II shows the sizes of the transistors in the preferred embodiment.

TABLE II

| Transistor | Wn | Ln | Transistor | Wp | Lp |
|---|---|---|---|---|---|
| N10 | 7.2 | 1.0 | P10 | 7.2 | 1.0 |
| N12 | 2.4 | 1.0 | P12 | 7.2 | 1.0 |
| N14 | 7.2 | 1.0 | P14 | 2.4 | 1.0 |
| N16 | 2.4 | 1.0 | P16 | 7.2 | 1.0 |
| N18 | 7.2 | 1.0 | P18 | 2.4 | 1.0 |
| N20 | 7.2 | 1.0 | P20 | 7.2 | 1.0 |
| N22 | 12.0 | 1.0 | P22 | 12.0 | 1.0 |
| N24 | 12.0 | 1.0 | P24 | 12.0 | 1.0 |

Figure 6:
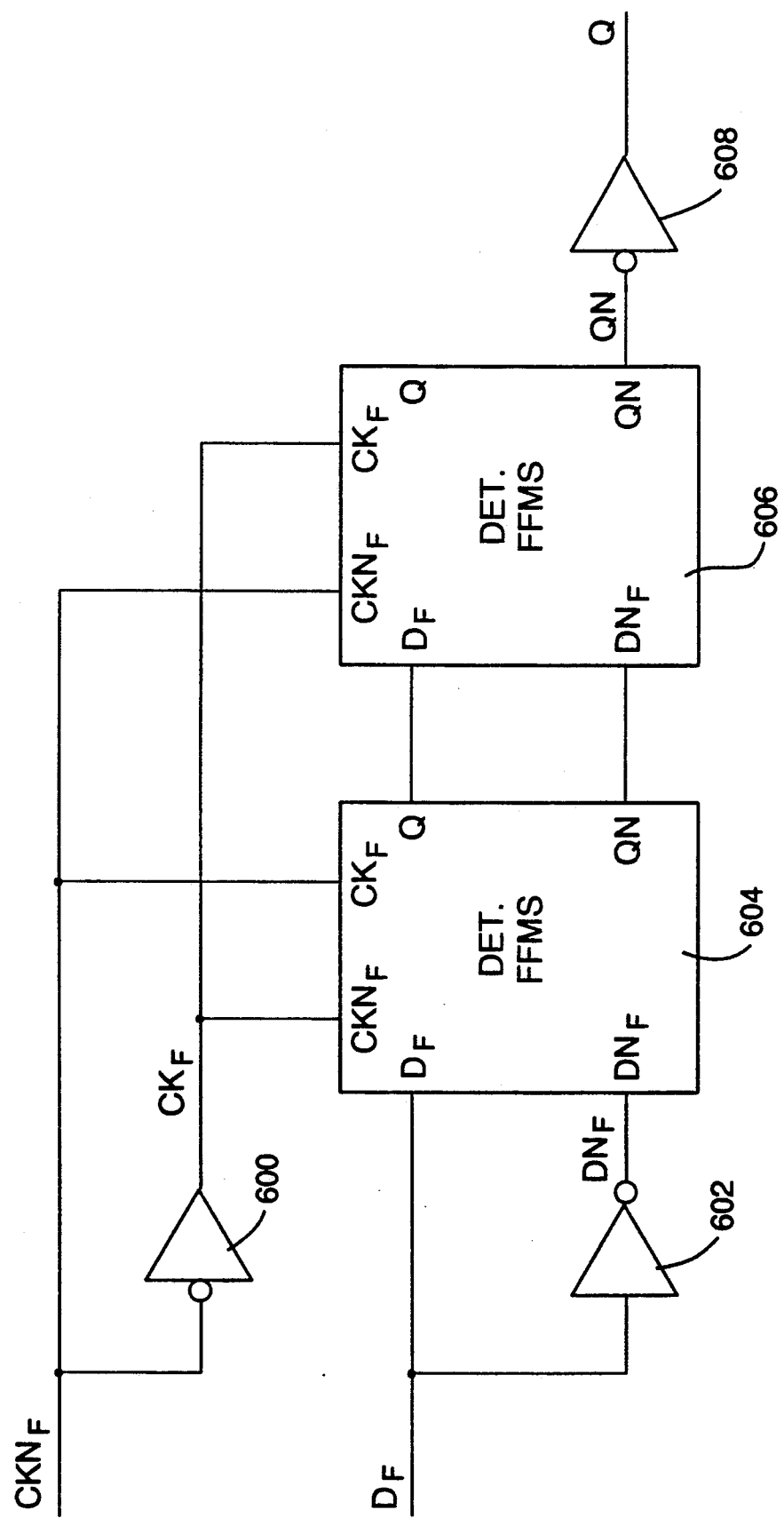
FIG. 6 shows a block diagram of the flip flop of FIG. 5.

Two RAM sections are joined to form a flip flop as shown in FIG. 6. The flip flop of FIG. 6 has a single clock and data input which requires the clock inverter 600 and the data inverter 602. The master flip flop 604 and the slave flip flop 606 each have a data line $D_F$, an inverse data line $DN_F$, a clock signal $CK_F$ and an inverted clock signal $CKN_F$ input. An inverted clock signal is applied to the input of the clock inverter 600, to the clock input $CK_F$ of the master flip flop 604 and to the inverted clock input $CKN_F$ of the slave flip flop 606. The output of the clock inverter 600 is applied to the inverted clock input $CKN_F$ of the master flip flop 604 and to the clock input $CKF_F$ of the slave flip flop 606.

A data signal is applied to the input of the data inverter 602 and to the data input $D_F$ of the master flip flop 604. The output of the data inverter 602 is coupled to the inverse data line $DN_F$ input of the master flip flop 604. The Q output of the master flip flop 604 is coupled to the data line $D_F$ input of the slave flip flop 606. The inverted output QN of the master flip flop 604 is coupled to the inverse data line $DN_F$ input of the slave flip flop 606. The inverted output of the slave flip flop 606 is coupled to an inverter 608.

The sizes of the transistors to meet the need of the preferred circuit are shown in Table III.

TABLE III

| Transistor | Wn | Ln | Wp | Lp |
|---|---|---|---|---|
| Clock Inverter | 14.4 | 1.0 | 9.6 | 1.0 |
| Data Inverter | 12.0 | 1.0 | 6.0 | 1.0 |
| Output Inverter | 48.0 | 1.0 | 24.0 | 1.0 |

Figure 7:
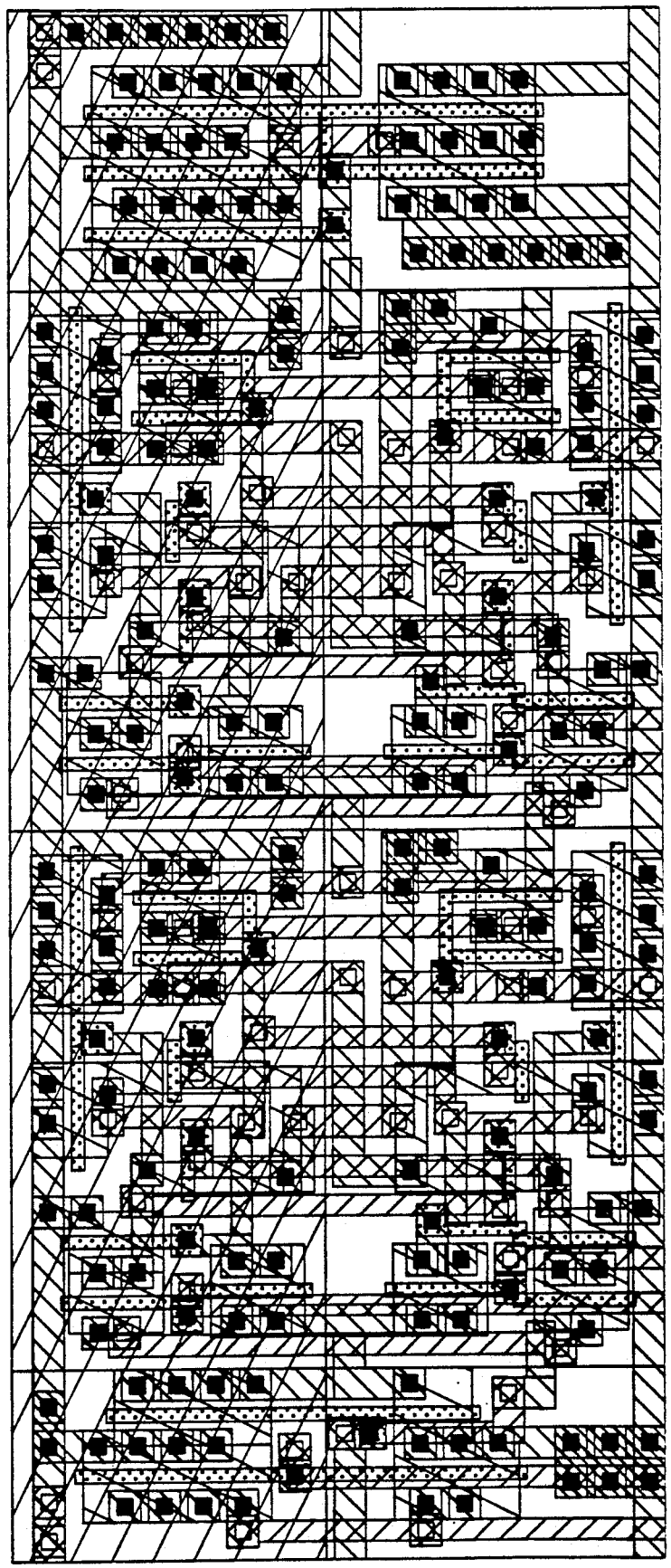
FIG. 7 shows a semiconductor mask layout for the flip flop of FIGS. 5 and 6.

The preferred flip flop cell mask layout for the circuit of FIGS. 5 and 6 is shown in FIG. 7 for a single polysilicon, double metal layer CMOS process. The cross-hatching to identify the individual layers is also shown in FIG. 8. A person of ordinary skill in the art can readily identify the structures shown in FIG. 7.

What is claimed is:

1. A cross coupled storage cell for a single binary bit of information comprising:

a) first cross coupled means for storing the bit;

b) second cross coupled means for storing the bit; and c) means for cross coupling the first cross coupled means to the second cross coupled means.

2. The apparatus according to claim 1 wherein the first cross coupled means comprises all n-channel transistors and the second means comprises all p-channel transistors.

3. The apparatus according to claim 2 wherein each of the transistors has a source, a drain and a gate a) wherein the first cross coupled means comprises:
   1) a first n-channel storage node and a second n-channel storage node;
   2) a first n-channel storage transistor having its drain coupled to the first n-channel storage node and its source couple to a ground potential;
   3) a second n-channel storage transistor having its drain coupled to the first n-channel storage node and its source coupled to the ground potential;
   4) a first n-channel load transistor having its drain coupled to a power supply potential and its source coupled to the first n-channel storage node; and
   5) a second n-channel load transistor having its drain coupled to the power supply potential and its source coupled to the second n-channel storage node;
   6) the gate of the first n-channel storage transistor is coupled to the second n-channel storage node; and
   7) the gate of the second n-channel transistor is coupled to the first n-channel storage node;

b) wherein the second cross coupled means comprises:
   1) a first p-channel storage node and a second p-channel storage node;
   2) a first p-channel storage transistor having its source coupled to the first storage node and its drain coupled to the power supply potential;
   3) a second p-channel storage transistor having its source coupled to the first storage node and its drain coupled to the power supply potential;
   4) a first p-channel load transistor having its source coupled to the ground supply potential and its drain coupled to the first p-channel storage node; and
   5) a second p-channel load transistor having its source coupled to the ground potential and its drain source coupled to the second p-channel storage node;
   6) the gate of the first n-channel storage transistor is coupled to the second n-channel storage node; and
   7) the gate of the second n-channel transistor is coupled to the first n-channel storage node; and c) wherein the means for cross coupling the first cross coupled means to the second cross coupled means comprises:
   1) the gate of the first n-channel load transistor is coupled to the first p-channel storage node;
   2) the gate of the second n-channel load transistor is coupled to the second p-channel storage node;
   3) the gate of the first p-channel load transistor is coupled to the first n-channel storage node; and
   4) the gate of the second p-channel load transistor is coupled to the second n-channel storage node.

4. The apparatus according to claim 3 wherein the p-channel load transistors are designed to carry less current than the n-channel storage transistors and the n-channel load transistors are designed to carry less current than the p-channel storage transistors.

5. The apparatus according to claim 4 wherein the storage cell is for a Static RAM.

6. The apparatus according to claim 4 wherein the storage cell is for a flip flop.

7. A CMOS storage cell comprising:
    a) an n-channel storage circuit including cross coupled n-channel storage transistors each having an n-channel load transistor; and
    b) a p-channel storage circuit including cross coupled p-channel storage transistors each having an n-channel load transistor, wherein the n-channel load transistors are coupled to be controlled by the p-channel storage circuit and the p-channel load transistors are coupled to be controlled by the n-channel storage circuit.

8. The apparatus according to claim 7 wherein the n-channel load transistors are designed to carry less current than the p-channel storage transistors and the p-channel load transistors are designed to carry less current than the n-channel storage transistors.

9. The apparatus according to claim 8 wherein the storage cell is for a Static RAM.

10. The apparatus according to claim 8 wherein the storage cell is for a flip flop.

* * * * *

UNITED STATES PATENT AND TRADEMARK OFFICE
CERTIFICATE OF CORRECTION

PATENT NO. : 5,111,429
DATED : May 05, 1992
INVENTOR(S) : Sterling R. Whitaker

It is certified that error appears in the above-identified patent and that said Letters Patent is hereby corrected as shown below:

On the Title page, item [54], delete "HARDENING" and replace with --HARDENED--.

In Column 1, Line 2 delete "HARDENING" and replace with --HARDENED--.

In Column 2, Line 27 delete "is".

In Column 2, Line 32 delete "$P_1$" and replace with --P1--.

In Column 3, Line 42 insert --be-- before "written".

In Column 3, Line 42 insert --to-- after "written".

In Column 4, Line 10 delete "meta12" and replace with --metal2--.

In Column 4, Line 20 delete "meta12" and replace with --metal2--.

In Column 4, Line 64 delete "conditions" and replace with --condition--.

In Column 5, Line 8 delete "conditions" and replace with --condition--.

UNITED STATES PATENT AND TRADEMARK OFFICE
CERTIFICATE OF CORRECTION

PATENT NO. : 5,111,429
DATED : May 5, 1992
INVENTOR(S) : Sterling R. Whitaker

It is certified that error appears in the above-indentified patent and that said Letters Patent is hereby corrected as shown below:

In Column 7, Line 33 delete "$CKF_F$" and replace with --$CK_F$--.

Signed and Sealed this

Seventeenth Day of August, 1993

Attest:

BRUCE LEHMAN

Attesting Officer

Commissioner of Patents and Trademarks